United States Patent
Huang et al.

(10) Patent No.: US 10,121,436 B2
(45) Date of Patent: Nov. 6, 2018

(54) SHIFT REGISTER, A GATE DRIVING CIRCUIT, A DISPLAY PANEL AND A DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fei Huang, Beijing (CN); Yi Zhang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 181 days.

(21) Appl. No.: 15/122,151

(22) PCT Filed: Jul. 31, 2015

(86) PCT No.: PCT/CN2015/085786
§ 371 (c)(1),
(2) Date: Aug. 26, 2016

(87) PCT Pub. No.: WO2016/150061
PCT Pub. Date: Sep. 29, 2016

(65) Prior Publication Data
US 2017/0018243 A1    Jan. 19, 2017

(30) Foreign Application Priority Data
Mar. 26, 2015 (CN) .......................... 2015 1 0137120

(51) Int. Cl.
*G11C 19/00* (2006.01)
*G09G 3/36* (2006.01)
*G11C 19/28* (2006.01)

(52) U.S. Cl.
CPC ............. *G09G 3/3677* (2013.01); *G09G 3/36* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS

| 2014/0119492 A1* | 5/2014 | Liu | G11C 19/28 377/64 |
| 2014/0169518 A1* | 6/2014 | Kong | G09G 3/3674 377/64 |

(Continued)

FOREIGN PATENT DOCUMENTS

| CN | 103943081 A | 7/2014 |
| CN | 204102544 U | 1/2015 |

(Continued)

OTHER PUBLICATIONS

International Search Report and Written Opinion from PCT Application Serial No. PCT/CN2015/085786, dated Dec. 16, 2015, 13 pages.

*Primary Examiner* — Tuan T Lam
(74) *Attorney, Agent, or Firm* — Kinney & Lange, P.A.

(57) ABSTRACT

The disclosure provides a shift register, a gate driving circuit, a display panel and a display apparatus. The shift register may comprise an inputting module, a resetting module, a pulling up module, a pulling down module for a first node, a pulling down module for a second node, an output controlling module and an output noise reducing (Continued)

module. The inputting module is used to pull up a potential of the first node. The resetting module is used to pull down the potential of the first node. The pulling up module is used to pull up the potential of the second node. The pulling down module for the first node is used to pull down the potential of the first node. The pulling down module for the second node is used to pull down the potential of the second node. The output controlling module is used to control the scanning signal outputting terminal to output a signal from the second clock signal terminal; and to connect the low level signal terminal with the third node, which can ensure that the shift register can output a scanning signal in a corresponding period. Meanwhile, the signal from the third node is noise reduced by the output noise reducing module and then outputted to the scanning signal outputting terminal, which can reduce the noise of the signal outputted from the scanning signal outputting terminal.

20 Claims, 6 Drawing Sheets

(52) U.S. Cl.
CPC ............... *G09G 2300/0809* (2013.01); *G09G 2310/0286* (2013.01)

(56) References Cited

U.S. PATENT DOCUMENTS

| | | | |
|---|---|---|---|
| 2015/0179277 A1* | 6/2015 | Pai | G09G 3/20 377/68 |
| 2016/0322115 A1* | 11/2016 | Xu | G11C 19/28 |
| 2017/0032752 A1* | 2/2017 | Huang | G09G 3/3648 |
| 2017/0039917 A1* | 2/2017 | Chen | G09G 3/36 |
| 2017/0076680 A1* | 3/2017 | Li | G09G 3/3648 |
| 2017/0256220 A1* | 9/2017 | Huang | G09G 3/3677 |

FOREIGN PATENT DOCUMENTS

| | | |
|---|---|---|
| CN | 104700803 A | 6/2015 |
| KR | 20130135629 A | 12/2013 |
| KR | 20150003054 A | 1/2015 |

* cited by examiner

SHIFT REGISTER, A GATE DRIVING CIRCUIT, A DISPLAY PANEL AND A DISPLAY APPARATUS

TECHNICAL FIELD

The present disclosure relates to a field of display technology, and more particular, to a shift register, a gate driving circuit, a display panel and a display apparatus.

BACKGROUND

Currently, with a development of liquid crystal display (LCD) technology, LCD panels become a highly competitive market. Reducing of a cost for manufacturing the LCD panel has become more and more important for LCD providers. In order to reduce the cost for manufacturing the LCD panels, those skilled in the art generally construct a gate driving circuit by using edges of the display panel. The gate driving circuit may comprise a plurality of shift registers, wherein each shift register corresponds to a gate line, and the plurality of shift registers are arranged in series with a trigger signal being transferred between two adjacent shift register. When each of the shift registers receives a trigger signal, the corresponding shift register may output a scanning signal to its corresponding gate line and transfer a trigger signal to a unit circuit in a next stage, so as to realize a function of driving the gates. This will eliminate a need for setting a separate gate driving chip on the border region of the display panel, as so to facilitate a narrow frame design of the display panel. Meanwhile, the cost of a related product can be reduced and the competitiveness of the product can be improved.

SUMMARY

Embodiments of the present disclosure provide a shift register, a gate driving circuit, a display panel and a display apparatus, which can at least solve the problem of the noise of the scanning signal outputted from an existing shift register being significant and the power consumption being high.

The embodiments of the present disclosure provide a shift register, comprising:
  an inputting module, having an input terminal connected to a first reference signal terminal, a control terminal connected to a signal inputting terminal and an output terminal connected to a first node, wherein the inputting module is configured to pull up a potential of the first node under the control of the signal inputting terminal;
  a resetting module, having an input terminal connected to a second reference signal terminal, a control terminal connected to a resetting signal terminal, and an output terminal connected to the first node, wherein the resetting module is configured to pull down the potential of the first node under the control of the resetting signal terminal;
  a pulling up module, having an input terminal and a control terminal connected to a first clock signal terminal, and an output terminal connected to a second node, wherein the pulling up module is configured to pull up the potential of the second node under the control of the first clock signal terminal;
  a pulling up module, having an input terminal and a control terminal connected to a first clock signal terminal, and an output terminal connected to a second node, wherein the pulling up module is configured to pull up the potential of the second node under the control of the first clock signal terminal;
  a pulling up module, having an input terminal and a control terminal connected to a first clock signal terminal, and an output terminal connected to a second node, wherein the pulling up module is configured to pull up the potential of the second node under the control of the first clock signal terminal;
  an output controlling module, connected to the low level signal terminal, a second clock signal terminal, the first node, the second node, a third node and the scanning signal outputting terminal, wherein the output controlling module is configured to control the scanning signal outputting terminal to output a signal from the second clock signal terminal, under the control of the first node; and to connect the low level signal terminal with the third node under the control of the second node, and
  an output noise reducing module, having an input terminal connected to the third node, a control terminal connected to a high level signal terminal, and an output terminal connected to the scanning signal outputting terminal, wherein the output noise reducing module is configured to perform a noise reduction) on a signal from the third node and output a noise reduced signal to the scanning signal outputting terminal.

In one implementation, according to the shift register of the embodiments of the present disclosure, the output noise reducing module may comprise a first switch transistor, and
  the first switch transistor has a gate connected to the high level signal terminal, a source connected to the third node, and a drain connected to the scanning signal outputting terminal.

In one implementation, according to the shift register of the embodiments of the present disclosure, the output controlling module may comprise a first output controlling module and a second output controlling module, and
  the first output controlling module has a first control terminal connected to the first node, a second control terminal connected to the third node, an input terminal connected to the second clock signal terminal, and an output terminal connected to the scanning signal outputting terminal, wherein the first output controlling module is configured to control the scanning signal outputting terminal to output the signal from the second clock signal terminal, under the control of the first node; and
  the second output controlling module has a first control terminal connected to the second node, a second control terminal connected to the low level signal terminal, an input terminal connected to the low level signal terminal, and an output terminal connected to the third node, wherein the second output controlling module is configured to connect the low level signal terminal to the third node, under the control of the second node.

In one implementation, according to the shift register of the embodiments of the present disclosure, the first output controlling module may comprise a second switch transistor and a first capacitor, and
  the second switch transistor has a gate connected to the first node, a source connected to the second clock signal terminal, and a drain connected to the scanning signal outputting terminal; and
  the first capacitor is connected between the first node and the third node.

In one implementation, according to the shift register of the embodiments of the present disclosure, the second output controlling module may comprise a third switch transistor and a second capacitor, and the third switch transistor has a gate connected to the second node, a source connected to the low level signal terminal, and a drain connected to the third node; and the second capacitor is connected between the second node and the low level signal terminal.

In one implementation, according to the shift register of the embodiments of the present disclosure, the pulling down module for the second node may comprise a first pulling down module and a second pulling down module, and the first pulling down module has an input terminal connected to the low level signal terminal, a control terminal connected to the first node, an output terminal connected to the second node, wherein the first pulling down module is configured to pull down the potential of the second node under the control of the first node; and the second pulling down module has an input terminal connected to the low level signal terminal, a control terminal connected to the scanning signal outputting terminal, an output terminal connected to the second node, wherein the second pulling down module is configured to further pull down the potential of the second node when the scanning signal outputting terminal outputs a scanning signal.

In one implementation, according to the shift register of the embodiments of the present disclosure, the first pulling down module may comprise a fourth switch transistor, and the fourth switch transistor has a gate connected to the first node, a source connected to the low level signal terminal, and a drain connected to the second node.

In one implementation, according to the shift register of the embodiments of the present disclosure, the second pulling down module may comprise a fifth switch transistor, and the fifth switch transistor has a gate connected to the scanning signal outputting terminal, a source connected to the low level signal terminal, and a drain connected to the second node.

In one implementation, according to the shift register of the embodiments of the present disclosure, the inputting module may comprise a sixth switch transistor, and the sixth switch transistor has a gate connected to the signal inputting terminal, a source connected to the first reference signal terminal, and a drain connected to the first node.

In one implementation, according to the shift register of the embodiments of the present disclosure, the resetting module may comprise a seventh switch transistor, and the seventh switch transistor has a gate connected to the resetting signal terminal, a source connected to the second reference signal terminal, and a drain connected to the first node.

In one implementation, according to the shift register of the embodiments of the present disclosure, the pulling down module for the first node may comprise an eighth switch transistor, and the eighth switch transistor has a gate connected to the second node, a source connected to the low level signal terminal, and a drain connected to the first node.

In one implementation, according to the shift register of the embodiments of the present disclosure, the pulling up module may comprise a ninth switch transistor, and the ninth switch transistor has a gate and a source connected to the first clock signal terminal, and a drain connected to the second node.

In one implementation, the shift register according to the embodiments of the present disclosure may further comprise a transmission module, and the transmission module has a control terminal connected to the high level signal terminal; an input terminal connected to the first node; and an output terminal connected to the first control terminal of the first output controlling module, wherein the transmission module is configured to perform a noise reduction on a signal outputted from the first node and output a noise reduced signal to the first output controlling module.

In one implementation, according to the shift register of the embodiments of the present disclosure, the transmission module may comprise a tenth switch transistor, and the tenth switch transistor has a gate connected to the high level signal terminal, a source connected to the first node, and a drain connected to the first control terminal of the first output controlling module.

The embodiments of the present disclosure provide a gate driving circuit, comprising a plurality of cascaded shift registers discussed above, wherein the scanning signal outputting terminal of each of shift registers other than a first shift register and a last shift register is configured to input a trigger signal to the signal inputting terminal of its next shift register which is adjacent to it, and to input a resetting signal to the resetting signal terminal of its previous shift register which is adjacent to it, and the scanning signal outputting terminal of the first shift register is configured to input the trigger signal to the signal inputting terminal of a second shift register, and the scanning signal outputting terminal of the last shift register is configured to input the resetting signal to the resetting signal terminals of its previous shift register and itself.

The embodiments of the present disclosure provide a display panel comprising the gate driving circuit discussed above.

The embodiments of the present disclosure provide a display apparatus comprising the display panel discussed above.

The embodiments of the present disclosure provide a shift register, a gate driving circuit, a display panel and a display apparatus. The shift register may comprise an inputting module, a resetting module, a pulling up module, a pulling down module for a first node, a pulling down module for a second node, an output controlling module and an output noise reducing module. The inputting module is used to pull up a potential of the first node under the control of the signal inputting terminal. The resetting module is used to pull down the potential of the first node under the control of the resetting signal terminal. The pulling up module is used to pull up the potential of the second node under the control of the first clock signal terminal. The pulling down module for the first node is used to pull down the potential of the first node under the control of the second node. The pulling down module for the second node is used to pull down the potential of the second node under the control of the first node and the scanning signal outputting terminal. The output controlling module is used to control the scanning signal outputting terminal to output a signal from the second clock signal terminal under the control of the first node; and to connect the low level signal terminal with the third node under the control of the second node, which can ensure that the shift register can output a scanning signal in a corresponding period. Meanwhile, the signal from the third node is noise reduced by the output noise reducing module and then outputted to the scanning signal outputting terminal, which can reduce the noise of the signal outputted from the scanning signal outputting terminal, improve a lossless transmission of the signal and reduce the power consumption, thereby improving the productivity and yield of the display panel.

DETAILED DESCRIPTION

Figure 1:
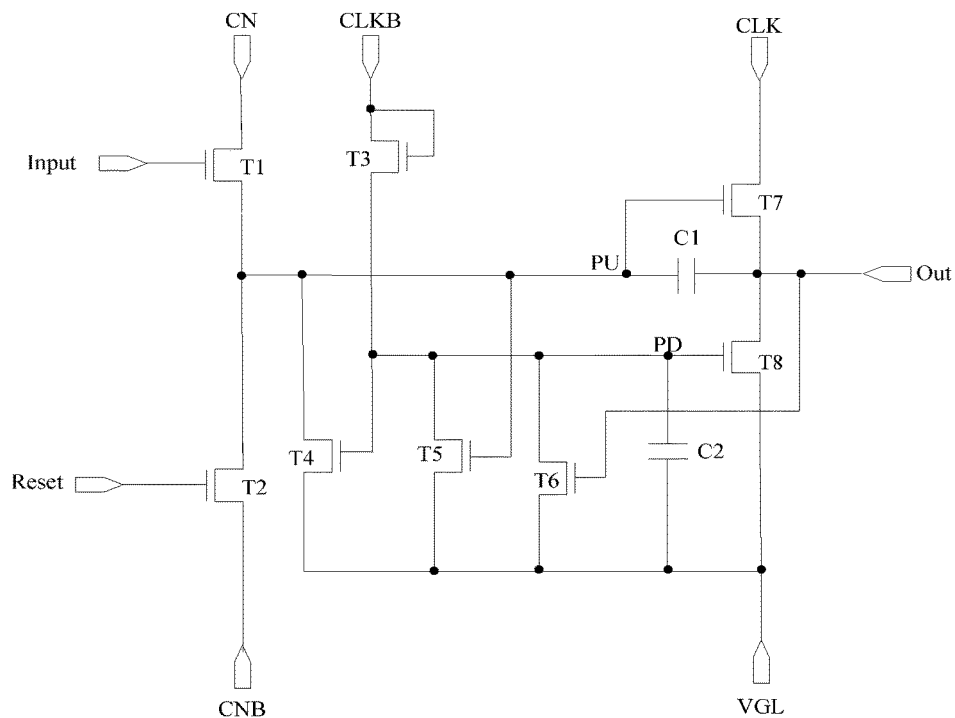
FIG. 1 is a structural diagram of a shift register in the prior art.
Figure 2:
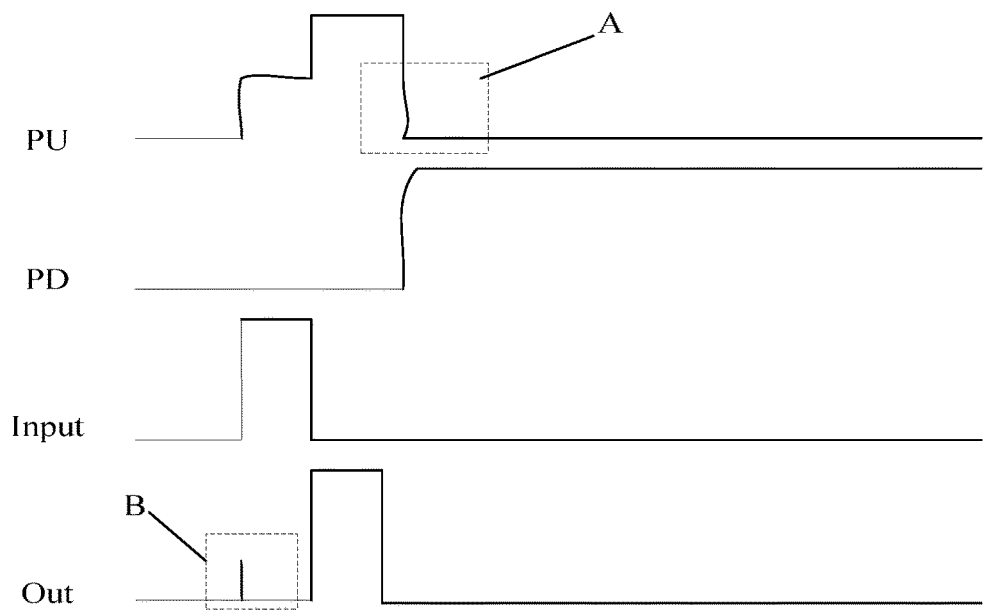
FIG. 2 is an input and output timing diagram of the shift register in the prior art.

Generally, FIG. 1 shows a structure of an existing shift register, and FIG. 2 shows an input and output timing diagram for the shift register of FIG. 1. As shown in FIG. 2, when the shift register starts to work, a potential of a first node PU is pulled up at a first period. Then, at a second period, the potential of the first node PU is further pulled up, which may lead to turning on of a seventh switch transistor T7. Thus, the scanning signal outputting terminal can output a corresponding scanning signal. However, since there may be a noise in a voltage signal from the first node PU (as shown in a region A of FIG. 2), and the first node PU may generate a high level signal when it is pulled up at a first time, the noise in the scanning signal outputted from the scanning signal outputting terminal will be increased by the charging and discharging processes of the capacitor C1 (as shown in a region B of FIG. 2). Thus, the power consumption of the shift register is increased, and the productivity and yield of the display panel is reduced.

Thus, it is a problem to reduce the noise of the scanning signal outputted from the shift register and to reduce the power consumption of the shift register, so as to improve the productivity and yield of the display panel.

Specific implementations of a shift register, a gate driving circuit, a display panel and a display apparatus according to embodiments of the present disclosure will be described in detail below in conjunction with accompanying drawings.

Figure 3:
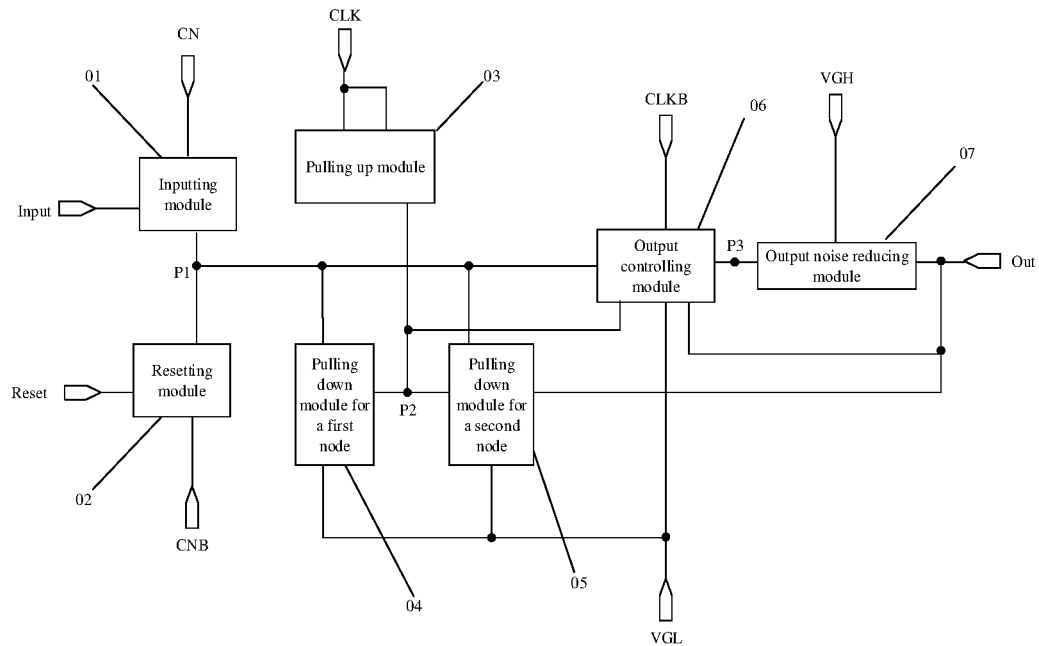
FIG. 3 is a structural diagram of a shift register according to the embodiments of the present disclosure.

According to the embodiments of the present disclosure, as shown in FIG. 3, a shift register is provided. The shift register may comprise: an inputting module 01, a resetting module 02, a pulling up module 03, a pulling down module for a first node 04, a pulling down module for a second node 05, an output controlling module 06 and an output noise reducing module 07.

The inputting module 01 may have an input terminal connected to a first reference signal terminal (CN), a control terminal connected to a signal inputting terminal (Input) and an output terminal connected to a first node (P1), wherein the inputting module 01 is configured to pull up a potential of the first node (P1) under the control of the signal inputting terminal (Input).

The resetting module 02 may have an input terminal connected to a second reference signal terminal (CNB), a control terminal connected to a resetting signal terminal (Reset), and an output terminal connected to the first node (P1), wherein the resetting module 02 is configured to pull down the potential of the first node (P1) under the control of the resetting signal terminal (Reset).

The pulling up module 03 may have an input terminal and a control terminal connected to a first clock signal terminal (CLK), and an output terminal connected to a second node (P2), wherein the pulling up module 03 is configured to pull up the potential of the second node (P2) under the control of the first clock signal terminal (CLK).

The pulling down module for the first node 04 may have an input terminal connected to a low level signal terminal (VGL), a control terminal connected to the second node (P2), and an output terminal connected to the first node (P1), wherein the pulling down module for the first node 04 is configured to pull down the potential of the first node (P1) under the control of the second node (P2).

The pulling down module for the second node 05 may have an input terminal connected to a low level signal terminal (VGL), a first control terminal connected to the first node (P1), a second control terminal connected to a scanning signal outputting terminal (Out), and an output terminal connected to the second node (P2), wherein the pulling down module for the second node 05 is configured to pull down the potential of the second node (P2) under the control of the first node (P1) and the scanning signal outputting terminal (Out).

The output controlling module 06 may be connected to the low level signal terminal (VGL), a second clock signal terminal (CLKB), the first node (P1), the second node (P2), a third node (P3) and the scanning signal outputting terminal (Out), wherein the output controlling module 06 is configured to control the scanning signal outputting terminal (Out) to output a signal from the second clock signal terminal (CLKB), under the control of the first node (P1); and to connect the low level signal terminal (VGL) with the third node (P3) under the control of the second node (P2).

The output noise reducing module 07 may have an input terminal connected to the third node (P3), a control terminal connected to a high level signal terminal (VGH), and an output terminal connected to the scanning signal outputting terminal (Out), wherein the output noise reducing module 07 is configured to perform a noise reduction on a signal from the third node (P3) and output the noise reduced signal to the scanning signal outputting terminal (Out).

According to the embodiments of the present disclosure, the shift register may comprise an inputting module 01, a resetting module 02, a pulling up module 03, a pulling down module for a first node 04, a pulling down module for a second node 05, an output controlling module 06 and an output noise reducing module 07. The inputting module 01 is used to pull up a potential of the first node (P1). The resetting module 02 is used to pull down the potential of the first node (P1). The pulling up module 03 is used to pull up the potential of the second node (P2). The pulling down module for the first node is used to pull down the potential of the first node (P1). The pulling down module for the second node is used to pull down the potential of the second node (P2). The output controlling module 06 is used to control the scanning signal outputting terminal (Out) to output a signal from the second clock signal terminal (CLKB), under the control of the first node (P1); and to connect the low level signal terminal (VGL) with the third node (P3) under the control of the second node (P2), which can ensure that the shift register can output a scanning signal in a corresponding period. Meanwhile, the signal from the third node (P3) is noise reduced by the output noise reducing module 07 and then outputted to the scanning signal outputting terminal (Out), which can reduce the noise of the signal outputted from the scanning signal outputting terminal (Out), improve a lossless transmission of the signal and reduce the power consumption, thereby improving the productivity and yield of the display panel.

Figure 4:
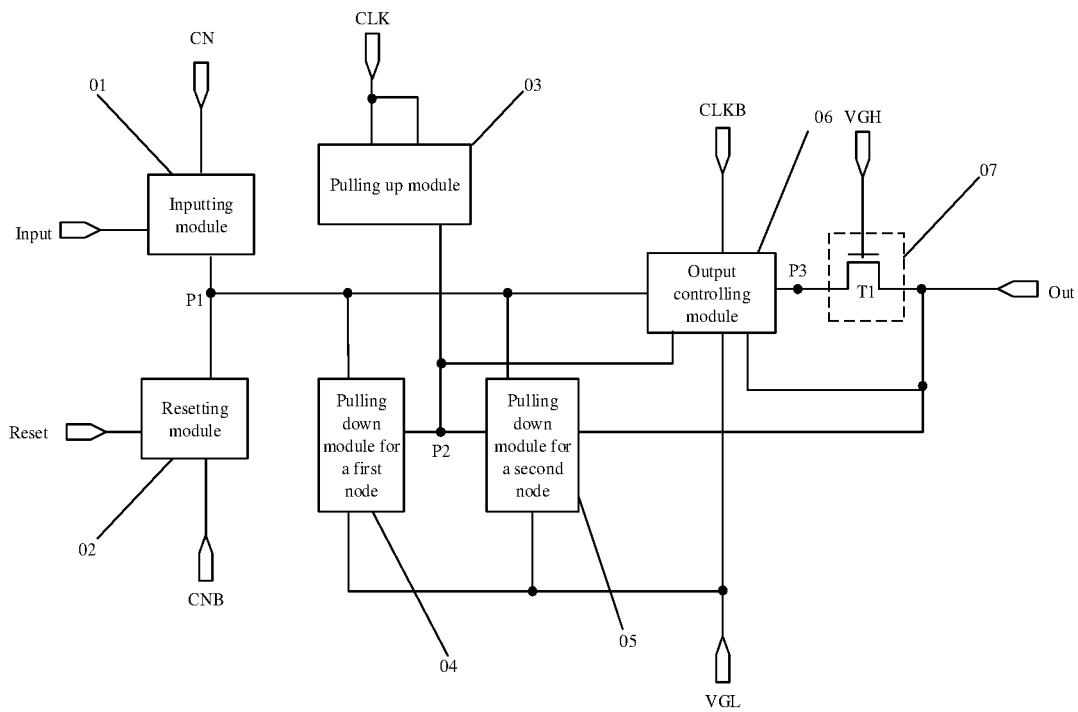
FIGS. 4 to 7 are detailed structural diagrams of the shift register according to the embodiments of the present disclosure, respectively.

In one implementation, according to the shift register of the embodiments of the preset disclosure, in particular, the output noise reducing module 07 may comprises a first switch transistor T1, as shown in FIG. 4. The first switch transistor T1 has a gate connected to the high level signal terminal (VGH), a source connected to the third node (P3), and a drain connected to the scanning signal outputting terminal (Out).

In particular, the first switch transistor T1 is generally turned on under the control of the high level signal terminal (VGH) and operated as a single transmission gate. The first switch transistor T1 may perform a noise reduction on the signal from the third node (P3) and transmit a noise reduced signal to the scanning signal outputting terminal (Out), so as to reduce the noise of the signal from the scanning signal outputting terminal (Out), to improve a lossless transmission of the signal and to reduce the power consumption, thereby improving the productivity and yield of the display panel.

Figure 5:
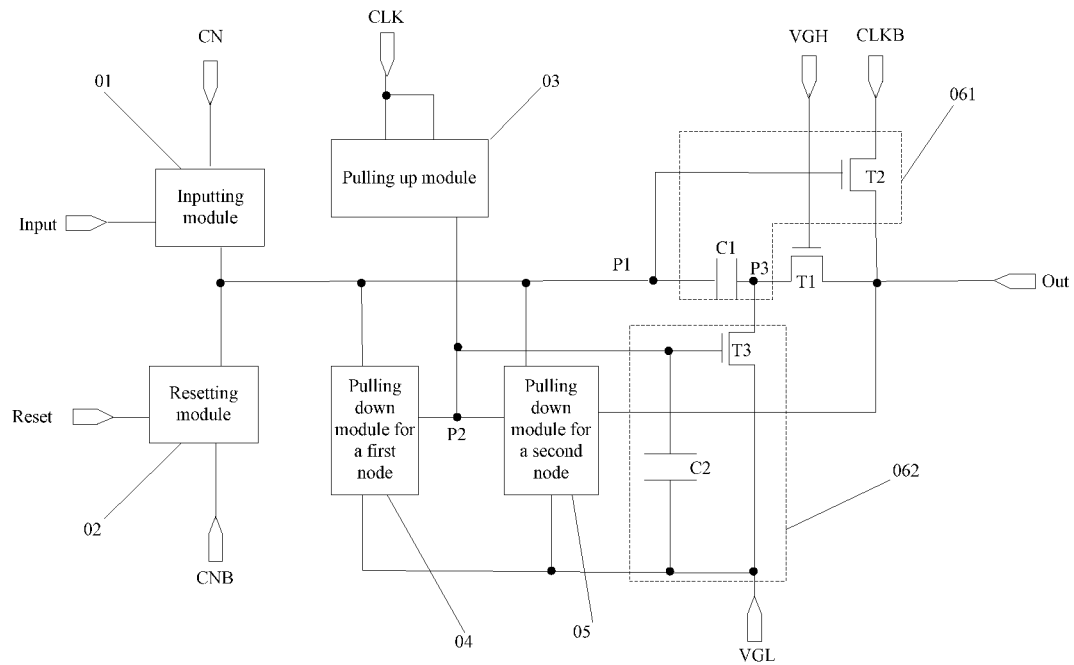

In one implementation, according to the shift register of the embodiments of the preset disclosure, in particular, the output controlling module 06 comprises a first output controlling module 061 and a second output controlling module 062, as shown in FIG. 5.

The first output controlling module 061 may have a first control terminal connected to the first node (P1), a second control terminal connected to the third node (P3), an input terminal connected to the second clock signal terminal (CLKB), and an output terminal connected to the scanning signal outputting terminal (Out), wherein the first output controlling module 061 is configured to control the scanning signal outputting terminal (Out) to output the signal from the second clock signal terminal (CLKB), under the control of the first node (P1).

The second output controlling module 062 may have a first control terminal connected to the second node (P2), a second control terminal connected to the low level signal terminal (VGL), an input terminal connected to the low level signal terminal (VGL), and an output terminal connected to the third node (P3), wherein the second output controlling module 062 is configured to connect the low level signal terminal (VGL) to the third node (P3), under the control of the second node (P2).

In particular, the first output controlling module 061 may control the scanning signal outputting terminal (Out) to output the signal from the second clock signal terminal (CLKB), under the control of the first node (P1); and the second output controlling module 062 may connect the low level signal terminal (VGL) to the third node (P3), under the control of the second node (P2), thereby ensuring that the shift register can output a scanning signal to its corresponding gate lines in a corresponding period and drive the display panel to perform a progressive scanning. Meanwhile, the signal from the third node (P3) is noise reduced by the first switch transistor T1 and then outputted to the scanning signal outputting terminal (Out), which can cause a reduction of the noise of the signal outputted from the scanning signal outputting terminal (Out).

In one implementation, according to the shift register of the embodiments of the preset disclosure, in particular, the first output controlling module 061 comprises a second switch transistor T2 and a first capacitor C1. The second switch transistor T2 has a gate connected to the first node (P1), a source connected to the second clock signal terminal (CLKB), and a drain connected to the scanning signal outputting terminal (Out); and the first capacitor C1 is connected between the first node (P1) and the third node (P3).

In particular, when the potential of the first node (P1) is pulled up, the second switch transistor T2 is turned on. The turned on second switch transistor T2 can connect the second clock signal terminal (CLKB) with the scanning signal outputting terminal (Out). Meanwhile, the first capacitor C1 can boost the potential of the first node (P1), thereby maintaining the potential of the first node (P1).

In one implementation, according to the shift register of the embodiments of the preset disclosure, in particular, the second output controlling module 062 may comprise a third switch transistor T3 and a second capacitor C2, as shown in FIG. 5. The third switch transistor T3 has a gate connected to the second node (P2), a source connected to the low level signal terminal (VGL), and a drain connected to the third node (P3); and the second capacitor C2 is connected between the second node (P2) and the low level signal terminal (VGL).

In particular, when the potential of the second node P2 is pulled up, the third switch transistor T3 is turned on. The turned on third switch transistor T3 may connect the low level signal terminal (VGL) with the third node (P3). The signal from the third node (P3) is noise reduced by the first switch transistor T1 and then outputted to the scanning signal outputting terminal (Out), which can cause a reduction of the noise of the signal outputted from the scanning signal outputting terminal (Out). Meanwhile, the second capacitor C2 can further maintain the potential of the second node (P2), thereby reducing the noise in the voltage signal outputted from the second node (P2).

Figure 6:
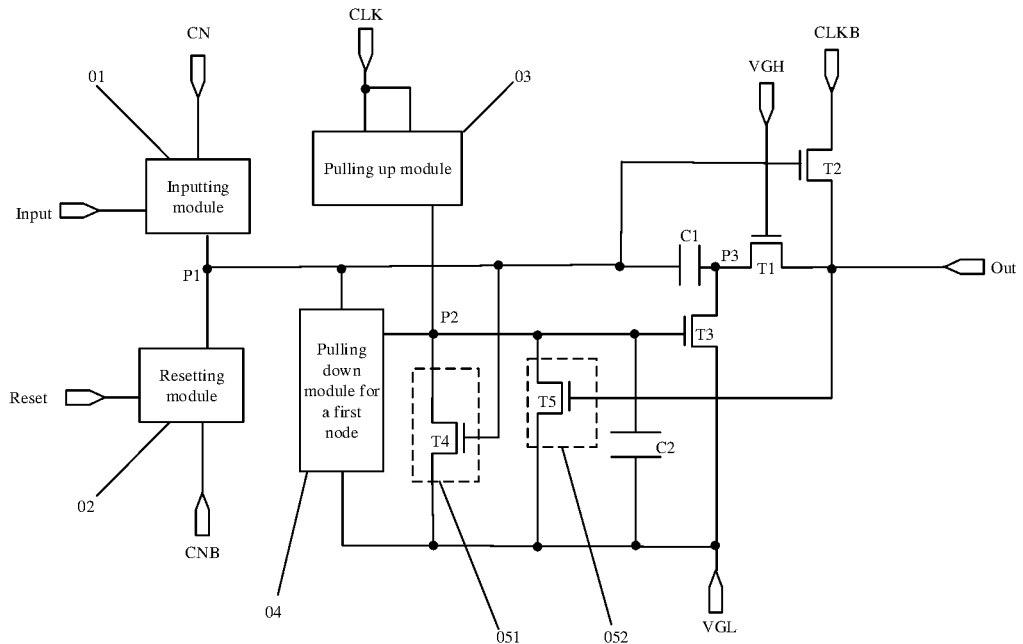

In one implementation, according to the shift register of the embodiments of the preset disclosure, in particular, the pulling down module for the second node 05 may comprise a first pulling down module 051 and a second pulling down module 052, as shown in FIG. 6. The first pulling down module 051 has an input terminal connected to the low level signal terminal (VGL), a control terminal connected to the first node (P1), an output terminal connected to the second node (P2). The first pulling down module 051 is configured to pull down the potential of the second node (P2) under the control of the first node (P1). The second pulling down module 052 has an input terminal connected to the low level signal terminal (VGL), a control terminal connected to the scanning signal outputting terminal (Out), an output terminal connected to the second node (P2), wherein the second pulling down module 052 is configured to further pull down the potential of the second node (P2) when the scanning signal outputting terminal (Out) outputs a scanning signal.

In particular, the first pulling down module 051 and the second pulling down module 052 are respectively configured to pull down the potential of the second node (P2) when the potential of the first node (P1) is pulled up and when the scanning signal outputting terminal (Out) outputs a scanning signal, thereby reducing the noise of the signal from the second node (P2).

In one implementation, according to the shift register of the embodiments of the preset disclosure, in particular, the first pulling down module 051 comprises a fourth switch transistor T4, as shown in FIG. 6. The fourth switch transistor T4 has a gate connected to the first node (P1), a source connected to the low level signal terminal (VGL), and a drain connected to the second node (P2).

In particular, when the potential of the first node (P1) is pulled up, the fourth switch transistor T4 is turned on. The turned on fourth switch transistor T4 may connect the low level signal terminal (VGL) with the second node (P2), so as to further pull down the potential of the second node (P2) and to reduce the noise of the signal from the second node (P2).

In one implementation, according to the shift register of the embodiments of the preset disclosure, in particular, the second pulling down module 052 may comprise a fifth switch transistor T5, as shown in FIG. 6. The fifth switch transistor T5 has a gate connected to the scanning signal outputting terminal (Out), a source connected to the low level signal terminal (VGL), and a drain connected to the second node (P2).

In particular, under the control of the scanning signal outputting terminal (Out), the fifth switch transistor T5 is turned on. The turned on fifth switch transistor T5 may connect the low level signal terminal (VGL) and the second node (P2), so as to pull further down the potential of the second node (P2), which can reduce the noise of the signal from the second node (P2).

Figure 7:
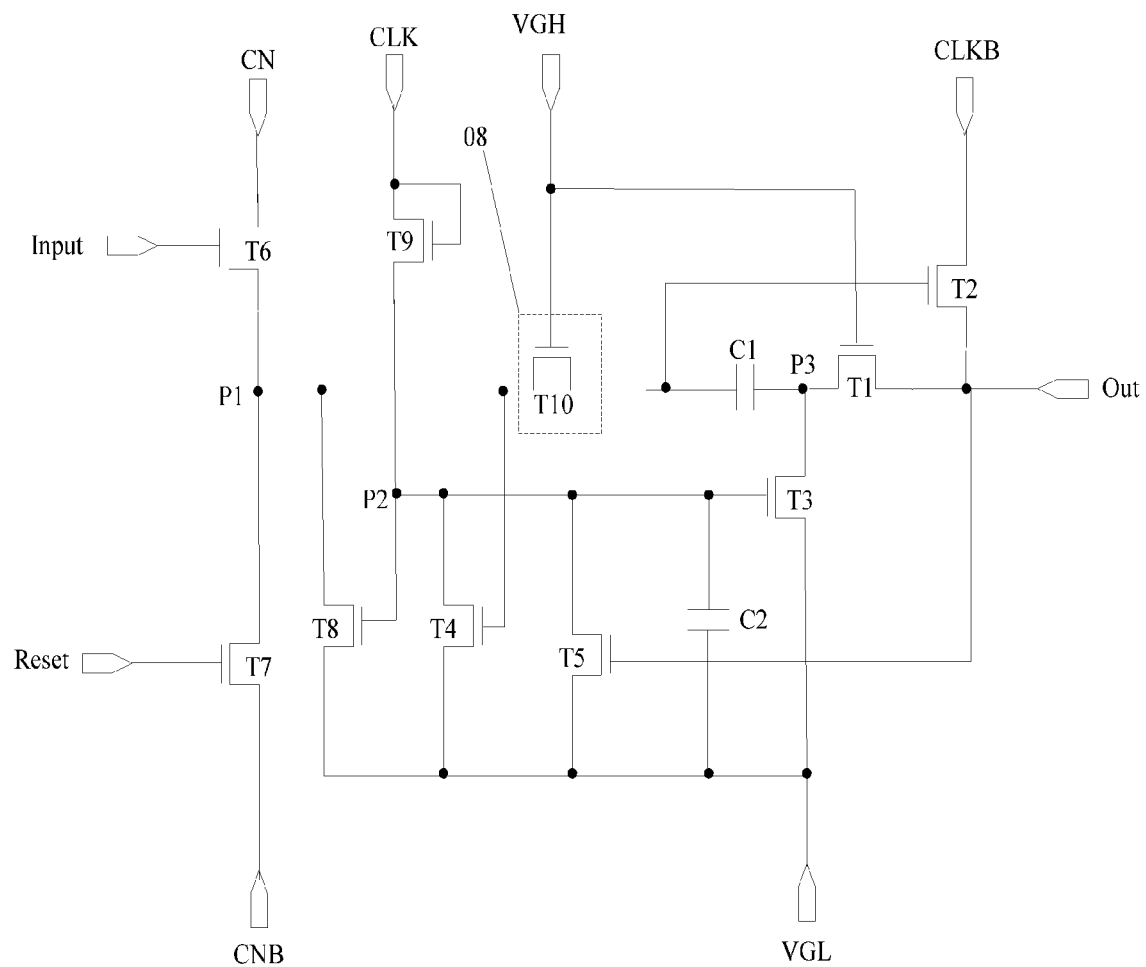

In one implementation, according to the shift register of the embodiments of the preset disclosure, in particular, the inputting module 01 may comprise a sixth switch transistor T6, as shown in FIG. 7. The sixth switch transistor T6 has a gate connected to the signal inputting terminal (Input), a source connected to the first reference signal terminal (CN), and a drain connected to the first node (P1).

In particular, under the control of the signal inputting terminal (Input), the sixth switch transistor T6 is turned on. The turned on sixth switch transistor T6 may connect the first reference signal terminal (CN) with the first node (P1), such that a signal is transferred from the first reference signal terminal (CN) to the first node (P1).

In one implementation, according to the shift register of the embodiments of the preset disclosure, in particular, the resetting module 02 may comprise a seventh switch transistor T7, as shown in FIG. 7. The seventh switch transistor T7 has a gate connected to the resetting signal terminal (Reset), a source connected to the second reference signal terminal (CNB), and a drain connected to the first node (P1).

In particular, under the control of the resetting signal terminal (Reset), the seventh switch transistor T7 is turned on. The turned on seventh switch transistor T7 may connect the second reference signal terminal (CNB) sigh the first node (P1), such that a signal is transferred from the second reference signal terminal (CNB) to the first node (P1).

In one implementation, according to the shift register of the embodiments of the preset disclosure, in particular, the pulling down module for the first node 04 may comprise an eighth switch transistor T8, as shown in FIG. 7. The eighth switch transistor T8 has a gate connected to the second node (P2), a source connected to the low level signal terminal (VGL), and a drain connected to the first node (P1).

In particular, when the potential of the second node (P2) is pulled up, the eighth switch transistor T8 is turned on. The turned on eighth switch transistor T8 may connect the first node (P1) with the low level signal terminal (VGL), so as to further pull down the potential of the first node (P1).

In one implementation, according to the shift register of the embodiments of the preset disclosure, in particular, the pulling up module 03 may comprise a ninth switch transistor T9, as shown in FIG. 7. The ninth switch transistor T9 has a gate and a source connected to the first clock signal terminal (CLK), and a drain connected to the second node (P2).

In particular, under the control of the first clock signal terminal (CLK), the ninth switch transistor T9 is turned on. The turned on ninth switch transistor T9 may connect the first clock signal terminal (CLK) with the second node (P2), so as to pull up the potential of the second node (P2).

In one implementation, in particular, the shift register according to the embodiments of the preset disclosure may further comprise a transmission module 08, as shown in FIG. 7. The transmission module 08 has a control terminal connected to the high level signal terminal (VGH); an input terminal connected to the first node (P1), the output terminal of the pulling down module for the first node 04, and the first control terminal of the pulling down module for the second node 05; and an output terminal connected to the first control terminal of the first output controlling module 061. The transmission module 08 is configured to perform a noise reduction on a signal outputted from the first node (P1) and output a noise reduced signal to the first output controlling module 061.

In particular, the transmission module 08 is generally turned on under the control of the high level signal terminal (VGH) and operated as the single transmission gate. Thus, the signal from the first node (P1) can be noise reduced and then outputted to the first output controlling module 061, thereby reducing the noise of the signal from the first control terminal of the first output controlling module 061.

In one implementation, according to the shift register of the embodiments of the preset disclosure, in particular, the transmission module 08 may comprise a tenth switch transistor T10, as shown in FIG. 7. The tenth switch transistor T10 has a gate connected to the high level signal terminal (VGH), a source connected to the first node (P1), and a drain connected to the first control terminal of the first output controlling module 061.

In particular, the tenth switch transistor T10 is turned on under the control of the high level signal terminal (VGH), and operated as the single transmission gate. Thus, the signal from the first node (P1) can be noise reduced and then outputted to the first output controlling module 061, thereby reducing the noise of the signal from the first control terminal of the first output controlling module 061.

It should be noted that the switch transistor mentioned in the above embodiments of the present disclosure may be a thin film transistor (TFT), or a metal oxide semiconductor (MOS), which is not limited herein. In an implementation, a source and a drain of each of these transistors may have interchangeable functions and thus are not specifically distinguished here. Herein, the thin film transistor (TFT) is taken as an example for describing the detailed embodiments.

Furthermore, since the signal inputting terminal (Input) and the resetting signal terminal (Reset) are designed symmetrically in the shift register according to the embodiments of the present disclosure, which can have interchangeable functions. Thus, the shift register according to the embodiments of the present disclosure may perform a bidirectional scanning.

Generally, when performing a forward scanning, the first reference signal terminal (CN) may provide a high level signal, and the second reference signal terminal (CNB) may provide a low level signal, and when performing a reverse scanning, the first reference signal terminal (CN) may provide a low level signal, and the second reference signal terminal (CNB) may provide a high level signal.

Figure 8:
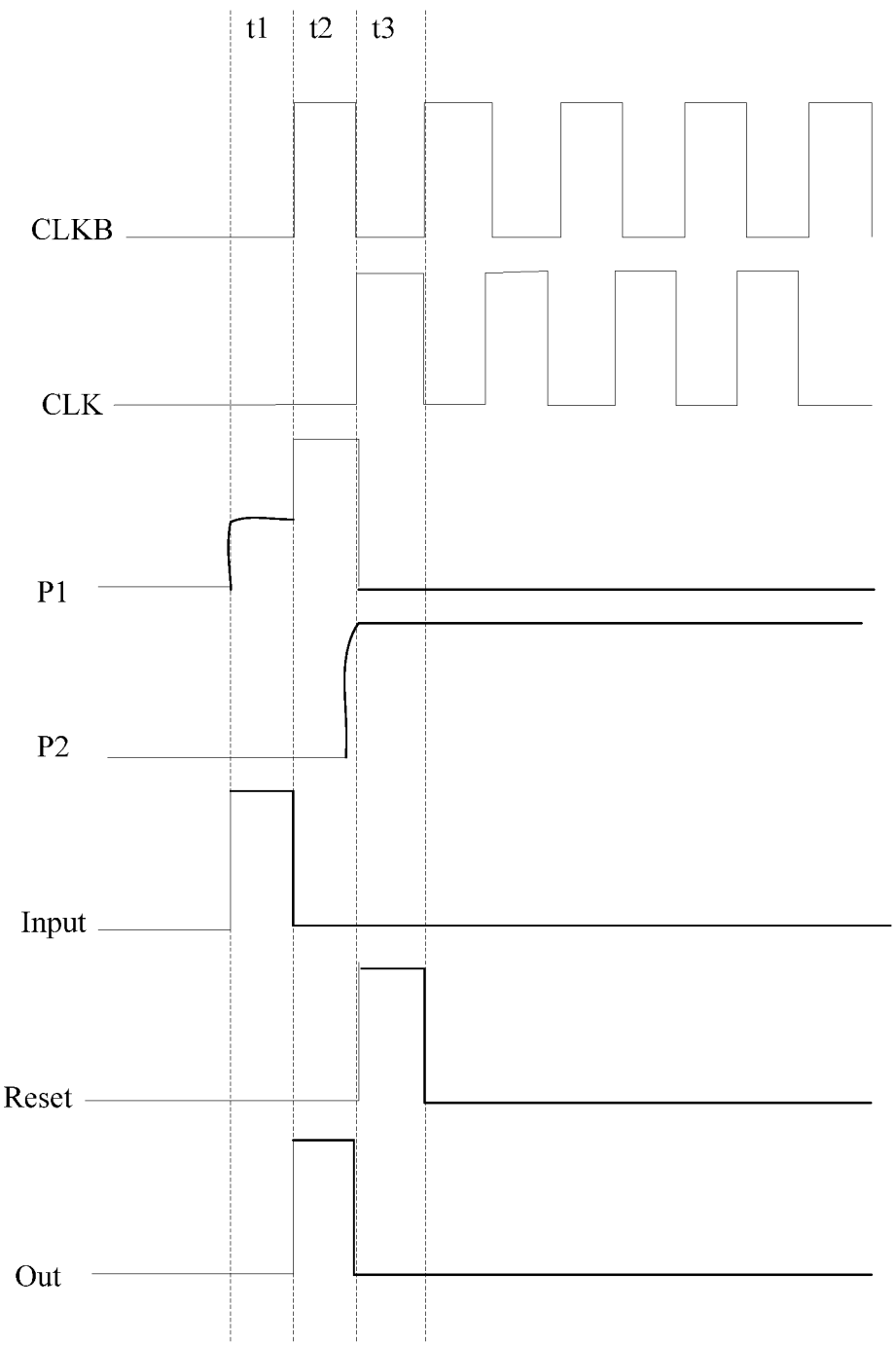
FIG. 8 is an input and output timing diagram of the shift register according to the embodiments of the present disclosure.

The operations of the shift register according to the embodiments of the present disclosure is detailed described with reference to the shift register shown in FIG. 7 and the inputting/outputting timing diagram for the shift register of FIG. 7 shown in FIG. 8, by taking the forward scanning operation as an example. In particular, three phases (t1~t3) in the inputting/outputting timing diagram of FIG. 8 are selected. In the following description, "1" represents a high level signal, and "0" represents a low level signal.

In the phase t1, Input=1, CLKB=0, CLK=0, Reset=0, CN=1 and CNB=0. Since Input=1, the sixth switch transistor T6 is turned on. The turned on sixth switch transistor T6 may connect the first reference signal terminal (CN) with the first node (P1), so as to pull up the potential of the first node (P1) and to charge the first capacitor (C1). Since the potential of the first node (P1) is pulled up, the second switch transistor T2 is turned on. The turned on second switch transistor T2 can connect the second clock signal terminal CLKB with the scanning signal outputting terminal (Out). At this time, since CLKB=0, the scanning signal outputting terminal (Out) outputs a low level signal. Thus, the phase t1 is a charging phase.

In the phase t2, Input=0, CLKB=1, CLK=0, Reset=0, CN=1 and CNB=0. Since the boosting of the first capacitor C1, the potential of the first node P1 is further pulled up. Thus, the second switch transistor T2 is turned on. While CLKB=1 at this time, the scanning signal outputting terminal (Out) may output a high level signal. Thus, the phase t2 is an outputting phase for the scanning signal.

In the phase t3, Input=0, CLKB=0, CLK=1, Reset=1, CN=1 and CNB=0. Since Reset=0, the seventh switch transistor T7 is turned on. The turned on seventh switch transistor T7 can connect the second reference signal terminal (CNB) with the first node (P1). Since CNB=0, the potential of the first node (P1) is pulled down. The second switch transistor T2 is turned off due to the potential of the first node (P1) being pulled down. While CLK=1 at this time, the ninth switch transistor T9 is turned on. The turned on ninth switch transistor T9 can connect the first clock signal terminal (CLK) with the second node (P2). Thus, the potential of the second node (P2) is pulled up, and the third switch transistor T3 is turned on. The turned on third switch transistor T3 can connect the low level signal terminal (VGL) with the third node (P3). The signal from the third node (P3) is noised reduced by the first switch transistor T1 and then outputted to the scanning signal outputting terminal (Out), i.e. the scanning signal outputting terminal (Out) may output a low level signal. Thus, the phase t3 is a non-outputting phase for the scanning signal.

In the subsequent phases, the scanning signal outputting terminal (Out) always outputs the low level signal, until the signal inputting terminal (Input) inputs a high level signal again in a certain phase. If so, the shift register will repeat the operations discussed above.

Based on the same inventive concept, the embodiments of the present disclosure may further provide a gate driving circuit comprising a plurality of cascaded shift registers discussed above. The scanning signal outputting terminal of each of shift registers other than a first shift register and a last shift register is configured to input a trigger signal to the signal inputting terminal of its next shift register which is adjacent to it, and to input a resetting signal to the resetting signal terminal of its previous shift register which is adjacent to it. The scanning signal outputting terminal of the first shift register is configured to input the trigger signal to the signal inputting terminal of a second shift register, and the scanning signal outputting terminal of the last shift register is configured to input the resetting signal to the resetting signal terminals of its previous shift register and itself.

Figure 9:
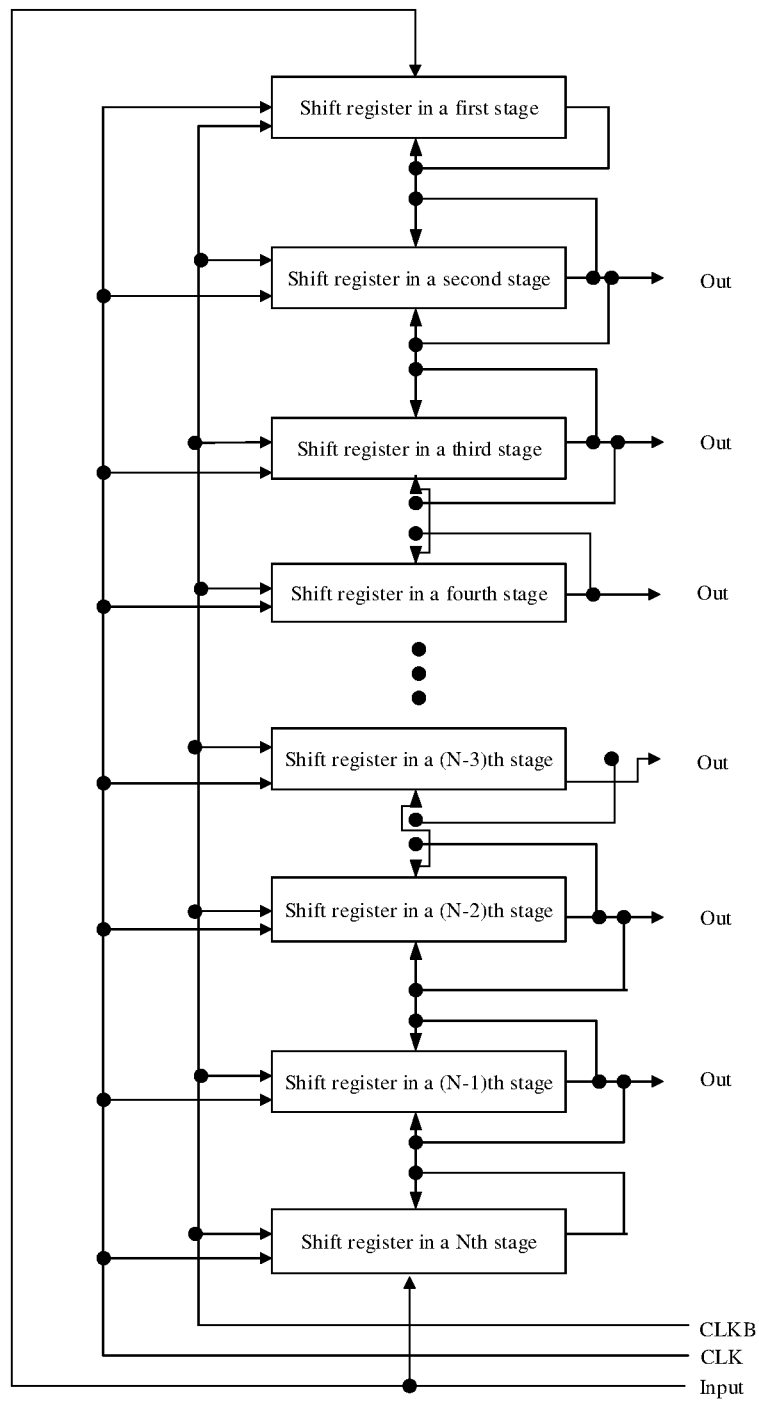
FIG. 9 is a structural diagram of the gate driving circuit according to the embodiments of the present disclosure.

In order to facilitate illustrating, FIG. 9 only shows eight shift registers, which are the shift register in a first stage, the shift register in a second stage, the shift register in a third stage, the shift register in a fourth stage, the shift register in a (N-3)th stage, the shift register in a (N-2)th stage, the shift register in a (N-1)th stage and the shift register in a Nth stage. The signal outputting terminal (Out) of the shift register in the (N-1)th stage is not only configured to output a gate turning on signal to a gate line connected with it and to output a resetting signal to the shift register in the (N-2)th stage, but also configured to output a trigger signal to the shift register in the Nth stage.

In particular, each shift register in the above gate driving circuit may have the same function and structure as the shift register according to the embodiments of the present disclosure, and the same content will not be repeated.

Based on the same inventive concept, the embodiments of the present disclosure further provide a display panel, comprising the gate driving circuit described above. Since the display panel has the same inventive concept as the gate driving circuit, a specific implementation thereof can be known with reference to the description of the gate driving circuit described above, and the same content will no longer be repeated.

Based on the same inventive concept, the embodiments of the present disclosure further provide a display apparatus, comprising the display panel described above. The display apparatus can be applied to any product or component having a display function, such as a mobile phone, a tablet, a TV, a display, a laptop, a digital frame, a navigator and the like. Since the display apparatus has the same inventive concept as the display panel, a specific implementation thereof can be known with reference to the description of the display panel described above, and the same content will no longer be repeated.

The embodiments of the present disclosure provide a shift register, a gate driving circuit, a display panel and a display apparatus. The shift register may comprise an inputting module, a resetting module, a pulling up module, a pulling down module for a first node, a pulling down module for a second node, an output controlling module and an output noise reducing module. The inputting module is used to pull up a potential of the first node under the control of the signal inputting terminal. The resetting module is used to pull down the potential of the first node under the control of the resetting signal terminal. The pulling up module is used to pull up the potential of the second node under the control of the first clock signal terminal. The pulling down module for the first node is used to pull down the potential of the first node under the control of the second node. The pulling down module for the second node is used to pull down the potential of the second node under the control of the first node and the scanning signal outputting terminal. The output controlling module is used to control the scanning signal outputting terminal to output a signal from the second clock signal terminal, under the control of the first node; and to connect the low level signal terminal with the third node under the control of the second node, which can ensure that the shift register can output a scanning signal in a corresponding period. Meanwhile, the signal from the third node is noise reduced by the output noise reducing module and then outputted to the scanning signal outputting terminal, which can reduce the noise of the signal outputted from the scanning signal outputting terminal, improve a lossless transmission of the signal and reduce the power consumption, thereby improving the productivity and yield of the display panel.

Obviously, those skilled in the art can make various modifications and variations to the present disclosure without departing from the spirit and scope of the present disclosure. Thus, if these modifications and variations of the present disclosure belong to the scope of the claims of the present disclosure and the equivalent technologies thereof, the present disclosure is also intended to include these modifications and variations.

We claim:

1. A shift register, comprising:

an inputting module, having an input terminal connected to a first reference signal terminal, a control terminal connected to a signal inputting terminal and an output terminal connected to a first node, wherein the inputting module is configured to pull up a potential of the first node under the control of the signal inputting terminal;

a resetting module, having an input terminal connected to a second reference signal terminal, a control terminal connected to a resetting signal terminal, and an output terminal connected to the first node, wherein the resetting module is configured to pull down the potential of the first node under the control of the resetting signal terminal;

a pulling up module, having an input terminal and a control terminal connected to a first clock signal terminal, and an output terminal connected to a second node, wherein the pulling up module is configured to pull up the potential of the second node under the control of the first clock signal terminal;

a pulling down module for the first node, having an input terminal connected to a low level signal terminal, a control terminal connected to the second node, and an output terminal connected to the first node, wherein the pulling down module for the first node is configured to pull down the potential of the first node under the control of the second node;

a pulling down module for the second node, having an input terminal connected to a low level signal terminal, a first control terminal connected to the first node, a second control terminal connected to a scanning signal outputting terminal, and an output terminal connected to the second node, wherein the pulling down module for the second node is configured to pull down the potential of the second node under the control of the first node and the scanning signal outputting terminal;

an output controlling module, connected to the low level signal terminal, a second clock signal terminal, the first node, the second node, a third node and the scanning signal outputting terminal, wherein the output controlling module is configured to control the scanning signal outputting terminal to output a signal from the second clock signal terminal, under the control of the first node, and to connect the low level signal terminal with the third node under the control of the second node; and an output noise reducing module, having an input terminal connected to the third node, a control terminal connected to a high level signal terminal, and an output terminal connected to the scanning signal outputting terminal, wherein the output noise reducing module is configured to perform a noise reduction on a signal from the third node and output a noise reduced signal to the scanning signal outputting terminal.

2. The shift register of claim 1, wherein the output noise reducing module comprises a first switch transistor, and the first switch transistor has a gate connected to the high level signal terminal, a source connected to the third node, and a drain connected to the scanning signal outputting terminal.

3. The shift register of claim 1, wherein the output controlling module comprises a first output controlling module and a second output controlling module, and the first output controlling module has a first control terminal connected to the first node, a second control terminal connected to the third node, an input terminal connected to the second clock signal terminal, and an output terminal connected to the scanning signal outputting terminal, wherein the first output controlling module is configured to control the scanning signal outputting terminal to output the signal from the second clock signal terminal, under the control of the first node; and the second output controlling module has a first control terminal connected to the second node, a second control terminal connected to the low level signal terminal, an input terminal connected to the low level signal terminal, and an output terminal connected to the third node, wherein the second output controlling module is configured to connect the low level signal terminal to the third node, under the control of the second node.

4. The shift register of claim 3, wherein the first output controlling module comprises a second switch transistor and a first capacitor, and the second switch transistor has a gate connected to the first node, a source connected to the second clock signal terminal, and a drain connected to the scanning signal outputting terminal; and the first capacitor is connected between the first node and the third node.

5. The shift register of claim 3, wherein the second output controlling module comprises a third switch transistor and a second capacitor, and the third switch transistor has a gate connected to the second node, a source connected to the low level signal terminal, and a drain connected to the third node; and the second capacitor is connected between the second node and the low level signal terminal.

6. The shift register of claim 1, wherein the pulling down module for the second node comprises a first pulling down module and a second pulling down module, and the first pulling down module has an input terminal connected to the low level signal terminal, a control terminal connected to the first node, an output terminal connected to the second node, wherein the first pulling down module is configured to pull down the potential of the second node under the control of the first node; and the second pulling down module has an input terminal connected to the low level signal terminal, a control terminal connected to the scanning signal outputting terminal, an output terminal connected to the second node, wherein the second pulling down module is configured to further pull down the potential of the second node when the scanning signal outputting terminal outputs a scanning signal.

7. The shift register of claim 6, wherein the first pulling down module comprises a fourth switch transistor, and the fourth switch transistor has a gate connected to the first node, a source connected to the low level signal terminal, and a drain connected to the second node.

8. The shift register of claim 6, wherein the second pulling down module comprises a fifth switch transistor, and the fifth switch transistor has a gate connected to the scanning signal outputting terminal, a source connected to the low level signal terminal, and a drain connected to the second node.

9. The shift register of claim 1, wherein the inputting module comprises a sixth switch transistor, and
the sixth switch transistor has a gate connected to the signal inputting terminal, a source connected to the first reference signal terminal, and a drain connected to the first node.

10. The shift register of claim 1, wherein the resetting module comprises a seventh switch transistor, and
the seventh switch transistor has a gate connected to the resetting signal terminal, a source connected to the second reference signal terminal, and a drain connected to the first node.

11. The shift register of claim 1, wherein the pulling down module for the first node comprises an eighth switch transistor, and
the eighth switch transistor has a gate connected to the second node, a source connected to the low level signal terminal, and a drain connected to the first node.

12. The shift register of claim 1, wherein the pulling up module comprises a ninth switch transistor, and
the ninth switch transistor has a gate and a source connected to the first clock signal terminal, and a drain connected to the second node.

13. The shift register of claim 1, further comprising a transmission module, and
the transmission module has a control terminal connected to the high level signal terminal, an input terminal connected to the first node, the output terminal of the pulling down module for the first node, and an output terminal connected to the output controlling module, wherein the transmission module is configured to perform a noise reduction on a signal outputted from the first node and output a noise reduced signal to the output controlling module.

14. The shift register of claim 13, wherein the transmission module comprises a tenth switch transistor, and
the tenth switch transistor has a gate connected to the high level signal terminal, a source connected to the first node, and a drain connected to the first control terminal of the first output controlling module.

15. A gate driving circuit, comprising a plurality of cascaded shift registers of claim 1, wherein the scanning signal outputting terminal of each of shift registers other than a first shift register and a last shift register is configured to input a trigger signal to the signal inputting terminal of its next shift register which is adjacent to it, and to input a resetting signal to the resetting signal terminal of its previous shift register which is adjacent to it, and the scanning signal outputting terminal of the first shift register is configured to input the trigger signal to the signal inputting terminal of a second shift register, and the scanning signal outputting terminal of the last shift register is configured to input the resetting signal to the resetting signal terminals of its previous shift register and itself.

16. A display panel, comprising the gate driving circuit of claim 15.

17. A display apparatus, comprising the display panel of claim 16.

18. The shift register of claim 2, further comprising a transmission module, wherein:
the transmission module has a control terminal connected to the high level signal terminal, an input terminal connected to the first node, and an output terminal connected to the output controlling module, wherein the transmission module is configured to perform a noise reduction on a signal outputted from the first node and output a noise reduced signal to the output controlling module.

19. The shift register of claim 3, further comprising a transmission module, wherein:
the transmission module has a control terminal connected to the high level signal terminal, an input terminal connected to the first node, and an output terminal connected to the first control terminal of the first output controlling module, wherein the transmission module is configured to perform a noise reduction on a signal outputted from the first node and output a noise reduced signal to the first output controlling module.

20. The shift register of claim 6, further comprising a transmission module, wherein:
the transmission module has a control terminal connected to the high level signal terminal, an input terminal connected to the first node, and an output terminal connected to the output controlling module, wherein the transmission module is configured to perform a noise reduction on a signal outputted from the first node and output a noise reduced signal to the output controlling module.

* * * * *